United States Patent
Collins et al.

(10) Patent No.: US 9,048,415 B2
(45) Date of Patent: Jun. 2, 2015

(54) MEMORY CELLS INCLUDING TOP ELECTRODES COMPRISING METAL SILICIDE, APPARATUSES INCLUDING SUCH CELLS, AND RELATED METHODS

(75) Inventors: Dale W. Collins, Boise, ID (US); Marko Milojevic, Boise, ID (US); Scott E. Sills, Boise, ID (US); Si-Young Park, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 283 days.

(21) Appl. No.: 13/347,840

(22) Filed: Jan. 11, 2012

(65) Prior Publication Data

US 2013/0175494 A1 Jul. 11, 2013

(51) Int. Cl.
*H01L 47/00* (2006.01)
*H01L 45/00* (2006.01)

(52) U.S. Cl.
CPC .......... *H01L 45/085* (2013.01); *H01L 45/1233* (2013.01); *H01L 45/1266* (2013.01); *H01L 45/145* (2013.01); *H01L 45/146* (2013.01); *H01L 45/16* (2013.01)

(58) Field of Classification Search
CPC .... H01L 45/08; H01L 45/085; H01L 45/1266
USPC .................................................. 257/E45.002
See application file for complete search history.

(56) References Cited

U.S. PATENT DOCUMENTS

| | | | |
|---|---|---|---|
| 6,084,796 A | 7/2000 | Kozicki et al. | |
| 6,114,200 A | 9/2000 | Yew et al. | |
| 6,951,805 B2 | 10/2005 | Moore | |
| 7,423,282 B2 | 9/2008 | Park et al. | |
| 7,479,650 B2 | 1/2009 | Gilton | |
| 7,515,454 B2 | 4/2009 | Symanczyk | |
| 7,718,537 B2 | 5/2010 | Ufert | |
| 7,768,016 B2 | 8/2010 | Kreupl | |
| 7,842,938 B2 | 11/2010 | Venkatasamy et al. | |
| 2005/0226036 A1* | 10/2005 | Aratani et al. | 365/158 |
| 2006/0243973 A1* | 11/2006 | Gilton | 257/46 |
| 2007/0148882 A1* | 6/2007 | Dressler et al. | 438/296 |
| 2010/0065804 A1 | 3/2010 | Park | |
| 2010/0110764 A1 | 5/2010 | Sun et al. | |
| 2010/0187493 A1* | 7/2010 | Takahashi | 257/4 |
| 2010/0221906 A1 | 9/2010 | Metzger et al. | |
| 2010/0322008 A1 | 12/2010 | Yoneya et al. | |
| 2011/0180775 A1* | 7/2011 | Lin et al. | 257/4 |

OTHER PUBLICATIONS

Kozicki et al., Non-Volatile Memory Based on Solid Electrolytes, Proceedings Non-Volatile Memory Technology Symposium (2004) 8 pages.

* cited by examiner

*Primary Examiner* — Ermias Woldegeorgis
(74) *Attorney, Agent, or Firm* — TraskBritt

(57) ABSTRACT

Memory cells (e.g., CBRAM cells) include an ion source material over an active material and an electrode comprising metal silicide over the ion source material. The ion source material may include at least one of a chalcogenide material and a metal. Apparatuses, such as systems and devices, include a plurality of such memory cells. Memory cells include an adhesion material of metal silicide between a ion source material and an electrode of elemental metal. Methods of forming a memory cell include forming a first electrode, forming an active material, forming an ion source material, and forming a second electrode including metal silicide over the metal ion source material. Methods of adhering a material including copper and a material including tungsten include forming a tungsten silicide material over a material including copper and treating the materials.

25 Claims, 5 Drawing Sheets

MEMORY CELLS INCLUDING TOP ELECTRODES COMPRISING METAL SILICIDE, APPARATUSES INCLUDING SUCH CELLS, AND RELATED METHODS

TECHNICAL FIELD

Embodiments of the present disclosure relate to memory cells with top electrodes comprising metal silicide. More specifically, embodiments are directed to conductive bridge random access memory (CBRAM) cells and devices and methods of making the same.

BACKGROUND

In recent years, the computer memory industry is pursuing alternative memory types to replace or supplement memory devices such as dynamic random access memory (DRAM), Flash memory, etc. One of these alternative memory types is conductive bridging random access memory ("CBRAM"), also known as programmable metallization cell ("PMC") memory. A variety of CBRAM cells and methods of forming them are known in the art.

As an example, a CBRAM cell conventionally includes opposing electrodes on opposite sides of an active material, such as a chalcogenide glass or an oxide glass. The active material is commonly referred to as a solid electrolyte material. A first electrode (e.g., the inert electrode) includes a relatively inert metal (e.g., tungsten) and a second electrode (e.g., the active electrode) includes an electrochemically active metal (e.g., silver or copper). In such a conventional CBRAM cell, the second electrode functions as an ion source material. The resistance of the active material may be changed by applying a voltage across the opposing electrodes. Upon application of a voltage across the electrodes with a positive bias on the second electrode, silver or copper cations drift from the second electrode into the active material and are electrochemically reduced by electrons from the negatively-charged first electrode. The reduced silver or copper atoms are electro-deposited on the first electrode, and the electro-deposition process continues until the silver or copper atoms form a path of less resistance (also referred to as a "conductive bridge," "dendrite," or "filament") across the active material. The conductive bridge may remain in place for an indefinite period of time, without needing to be electrically refreshed or rewritten. Therefore, CBRAM may be referred to as a non-volatile memory.

The formation of the conductive bridge may be reversed, however, by applying a voltage with a reversed polarity (compared to the voltage used to form the conductive bridge) to the electrodes. When a voltage with a reversed polarity is applied to the electrodes, the metallic atoms or atomic clusters that form the conductive bridge are oxidized and migrate away from the conductive bridge into the active material and eventually to the second electrode, resulting in the removal of the low resistance path. Data in the CBRAM cell may be "read" by measuring the resistance between the electrodes. A relatively high resistance value (due to the lack of a conductive bridge between the opposing electrodes) may result in a certain memory state, such as a "0." A relatively low resistance value (due to the presence of a conductive bridge between the opposing electrodes) may result in a different memory state, such as a "1."

A CBRAM cell is formed by positioning an active material between a first electrode (e.g., an inert electrode, a bottom electrode) and a second electrode (e.g., an active electrode, a top electrode). The first electrode may be formed of any sufficiently inert conductive material, such as tungsten, titanium nitride, tantalum nitride, etc. The active material conventionally includes a chalcogenide (i.e., including sulfur, selenium, or tellurium) glass or an oxide glass. The second electrode may be formed of an active metal, such as silver or copper, or may be formed of a combination of a conductive ion source material and an inert metal cap of, for example, tungsten, titanium nitride, tantalum nitride, etc. The ion source material, if present, conventionally includes an active metal species (e.g., silver or copper) and is formed between the active material and the metal cap. The ion source material may provide ions for forming a conductive bridge across the active material when proper voltage is applied to the CBRAM cell.

In conventional configurations, an interface between the metal cap and the ion source material, when present, may be characterized by physisorption and little intermixing between the elements at the interface. Internal stresses in the materials of the CBRAM cell, combined with the characteristics of the interface, may cause at least one of adhesive failure and deformation of materials in the CBRAM cell. Poor adhesion and deformation cause problems with or prohibit device fabrication and memory cell performance. Accordingly, a CBRAM cell that reduces or eliminates adhesive failure and deformation is disclosed.

DETAILED DESCRIPTION

Figure 1:
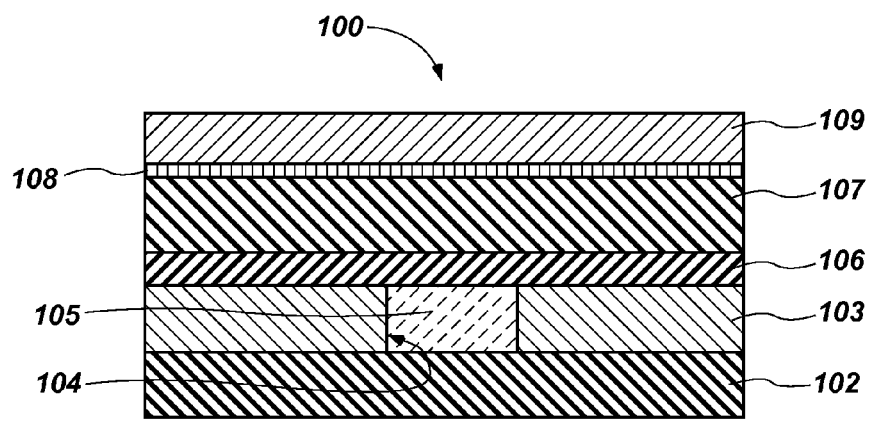
FIG. 1 shows a partial cross-sectional view of an embodiment of a CBRAM cell according to the present disclosure.

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry.

The fabrication processes described herein do not describe a complete process flow for processing memory device structures. The remainder of the process flow is known to those of ordinary skill in the art. Accordingly, only the methods and memory device structures necessary to understand embodiments of the present disclosure are described herein.

As used herein, the term "apparatus" means and includes a device, such as a memory device (e.g., a CBRAM device), or a system that includes such a device.

As used herein, the term "substantially" in reference to a given parameter means and includes to a degree that one skilled in the art would understand that the given parameter, property, or condition is met with a small degree of variance, such as within acceptable manufacturing tolerances.

As used herein, any relational term, such as "first," "second," "over," "top," "bottom," "underlying," etc., is used for clarity and convenience in understanding the disclosure and accompanying drawings and does not connote or depend on any specific preference, orientation, or order, except where the context clearly indicates otherwise.

As used herein, the term "forming" means and includes any method of creating, building, or depositing a material. For example, forming may be accomplished by atomic layer deposition (ALD), chemical vapor deposition (CVD), physical vapor deposition (PVD), sputtering, co-sputtering, spin-coating, diffusing, depositing, growing, or any other technique known in the art of semiconductor fabrication. Depending on the specific material to be formed, the technique for fanning the material may be selected by a person of ordinary skill in the art.

The embodiments described in the present disclosure include CBRAM cells, apparatuses including CBRAM cells, methods of forming CBRAM cells, and methods of adhering materials in CBRAM cells. The CBRAM cells of the present disclosure include an electrode (e.g., a first electrode, an active electrode, a top electrode) or portion of an electrode structure including a metal silicide, which provides improved adhesion between the electrode and an ion source material underlying the electrode, as will be described in more detail below. An interface between the metal silicide of the electrode and the ion source material may exhibit improved adhesion due at least in part to an increase in intermixing between the materials of the electrode and the materials of the ion source material, reduced mechanical stress at the interface, and greater chemical bonding (e.g., chemisorption) between materials across the interface. In some embodiments, the metal silicide of the electrode may be silicon-rich, as described in more detail below.

Although the embodiments described in the present disclosure relate generally to CBRAM cells, one of ordinary skill in the art will understand that the methods and apparatuses taught by the present disclosure may be applied to other memory types and configurations. For example, teachings from the present disclosure may be applied to phase-change random-access memory (PCRAM), programmable metallization cell (PMC) memory, resistive random-access memory (RRAM), etc. Furthermore, teachings from the present disclosure may be applied to memory having a so-called "cross-point" architecture or a so-called "confined cell" architecture.

Embodiments of the present disclosure including one or more CBRAM cells are shown by way of example in FIGS. 1 through 5. Similar structures or components in the various drawings may retain the same or similar numbering for the convenience of the reader; however, the similarity in numbering does not mean that the structures or components are necessarily identical in size, composition, configuration, or other property.

An embodiment of a CBRAM cell 100 is illustrated in FIG. 1 and is described as follows. The CBRAM cell 100 may include a first electrode 102, a dielectric material 103, a conductive material 105 disposed in an opening 104 in the dielectric material 103, an active material 106, a ion source material 107, an interfacial region 108, and a second electrode 109 including a metal silicide, as shown in FIG. 1.

The first electrode 102 (e.g., a bottom electrode, an inert electrode, a cathode) may include a conductive material, such as, for example, one or more of tungsten ("W"), nickel ("Ni"), tungsten nitride ("WN"), titanium nitride ("TiN"), tantalum nitride ("TaN"), polysilicon, and a metal silicide (e.g., $WSi_x$, $TiSi_x$, $CoSi_x$, $TaSi_x$, $MnSi_x$, where x is a rational number greater than zero). In some embodiments, the first electrode 102 may be a region of a semiconductor substrate doped so as to be electrically conductive. The first electrode 102 may be or be a part of a so-called "inert electrode" of a CBRAM cell.

The dielectric material 103 may be positioned over the first electrode 102 to isolate at least portions of the first electrode 102 from the active material 106 positioned over the dielectric material 103. By way of example and not limitation, the dielectric material 103 may include at least one of silicon nitride (e.g., $Si_3N_4$) and silicon oxide (e.g., $SiO_2$). The dielectric material 103 may be any dielectric material configured to electrically isolate at least portions of the first electrode 102 from other materials formed over the dielectric material 103, as will be described in more detail below.

The dielectric material 103 may have the opening 104 in which the conductive material 105 may be disposed for providing electrical contact between the first electrode 102 and the active material 106 positioned over the dielectric material 103. The conductive material 105 may be the inert electrode contact of the CBRAM cell 100 and may include, by way of non-limiting example, one or more of W, Ni, WN, TiN, TaN, polysilicon, a metal silicide, etc.

The active material 106 may be positioned over the dielectric material 103 and in electrical contact with the first electrode 102 through the conductive material 105. The active material 106 may be an oxide material (e.g., an oxide glass), such as at least one of a transition metal oxide (e.g., $HfO_x$, $ZrO_x$, $WO_x$, etc.), a silicon oxide (e.g., $SiO_2$), and an aluminum oxide (e.g., $Al_2O_3$), or a chalcogenide material (e.g., a chalcogenide glass). A chalcogenide material may include at least one of the chalcogen elements, such as sulfur (S), selenium (Se), and tellurium (Te).

The ion source material 107 may be positioned over the active material 106 and may be electrically conductive. The ion source material 107 may include an active metal species (e.g., copper or silver) for providing metal ions that drift into the active material 106 upon application of a voltage across the CBRAM cell 100 to form a conductive bridge through the active material 106. By way of example and not limitation, in some embodiments, the ion source material 107 may include copper. The ion source material 107 may also include a chalcogenide material. In some embodiments, the ion source material 107 may include at least one of tellurium and germanium. In some embodiments, the ion source material 107 may include, but is not limited to, a copper-tellurium (CuTe) material, a copper-tellurium-germanium (CuTeGe) material, or a copper-tellurium-silicon (CuTeSi) material. In other embodiments, the ion source material 107 may include, but is not limited to, a silver material (Ag), a silver-sulfur material (AgS), or a silver-selenium material (AgSe).

The active material 106 and the ion source material 107 may be formed and configured such that metal ions from the ion source material 107 may be flowable (e.g., movable) in the active material 106 upon application of a voltage (e.g., a threshold voltage) across the active material 106.

The second electrode 109 (e.g., a top electrode, an anode) may be positioned over the ion source material 107. The second electrode 109 may include a metal silicide (e.g., $WSi_x$, $TiSi_x$, $CoSi_x$, $TaSi_x$, $MnSi_x$, $RuSi_x$, $NiSi_x$, where x is a rational number greater than or equal to 1). The composition of the metal silicide of the second electrode 109 may be, for example, substantially homogeneous across a thickness thereof. The silicon content of the metal silicide may be substantially homogeneous across a thickness of the second electrode 109. The silicon in the metal silicide of the second electrode 109 may improve intermixing of materials between the second electrode 109 and the ion source material 107 compared to conventional configurations in which the second electrode does not include the metal silicide, as will be explained in more detail below. An interfacial region 108 may exist at an interface between the ion source material 107 and the second electrode 109. The interfacial region 108 may include a continuous or discontinuous layer formed as a reaction product of the materials of the ion source material 107 and of the second electrode 109.

The metal silicide of the second electrode 109 may include stoichiometric amounts of silicon and the metal or may be silicon-rich to provide silicon atoms for bonding with the ion source material 107. As used herein, the phrase "silicon-rich" refers to a greater number of silicon atoms in a mixture of silicon and the metal than is needed to provide a stoichiometric ratio with the metal. By way of example and not limitation, the chemical formula for stoichiometric tungsten silicide is $WSi_2$, indicating that there are two silicon atoms for every tungsten atom. A silicon-rich tungsten silicide may have more than two silicon atoms for every tungsten atom. Thus, a silicon-rich tungsten silicide may have the chemical formula of $WSi_x$, where x is a rational number greater than two. By way of example, a silicon-rich tungsten silicide may have a ratio of number of silicon atoms to number of tungsten atoms (Si:W) of between about 2.1:1 and about 3.5:1. In some embodiments, the ratio of the number of silicon atoms to number of tungsten atoms may be between about 2.4:1 and about 3.0:1. In one embodiment, the ratio may be about 2.7 silicon atoms per tungsten atom.

Compared to conventional CBRAM cells lacking a metal silicide in the second (e.g., active) electrode, the CBRAM cell 100 including metal silicide in the second electrode 109 may at least one of: improve adhesion between the second electrode 109 and the ion source material 107; provide greater intermixing of the materials of the second electrode 109 and the ion source material 107 across the interface between the second electrode 109 and the ion source material 107; provide a broader interfacial region 108; and reduce interfacial stress (es) between the materials of the CBRAM cell 100 of the present disclosure. Each of these characteristics may provide improved manufacturability and/or device performance of the CBRAM cell 100 and a memory device including the CBRAM cell 100.

Accordingly, a memory cell is described including a first electrode, an active material in electrical contact with the first electrode, an ion source material over the active material, and a second electrode including a metal silicide over the ion source material. The metal silicide of the second electrode may be silicon-rich. The metal silicide of the second electrode may be substantially homogeneous. The active material may be an oxide material or a chalcogenide material. The memory cell may also include a dielectric material between the first electrode and the active material.

An embodiment of a method of forming the CBRAM cell 100 (FIG. 1) is illustrated in FIGS. 2A through 2D and is described as follows. Forming the CBRAM cell 100 includes forming the first electrode 102, forming the active material 106, forming the ion source material 107, and forming the second electrode 109 including the metal silicide over the ion source material 107, as will be described in more detail below.

Figure 2A:
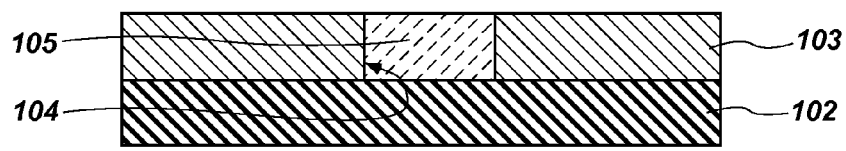
FIGS. 2A through 2D illustrate an embodiment of a method of forming a CBRAM cell, such as the CBRAM cell of FIG. 1.

Referring to FIG. 2A, the first electrode 102 may be formed of an electrically conductive material. The first electrode 102 may be formed over or in a substrate (not shown), such as a semiconductor substrate. The formation of the first electrode 102 may be accomplished by conventional techniques and is, therefore, not described in detail in the present disclosure.

With continued reference to FIG. 2A, the dielectric material 103 may be formed over the first electrode 102. By way of example and not limitation, the dielectric material 103 may be formed of at least one of silicon nitride (e.g., $Si_3N_4$) and silicon oxide (e.g., $SiO_2$). The dielectric material 103 may be formed by conventional techniques and is, therefore, not described in detail in the present disclosure. In one embodiment, the dielectric material 103 may be formed by forming silicon nitride over the first electrode 102. At least one opening 104 may be formed through the dielectric material 103 by conventional methods (e.g., photolithography) and at least partially filled with a conductive material 105 (e.g., TiN) to provide electrical connection between the first electrode 102 and the active material 106 formed over the dielectric material 103, as will be described in more detail below. The conductive material 105 may be deposited in the opening 104 and polished (e.g., by chemical mechanical planarization).

Figure 2B:
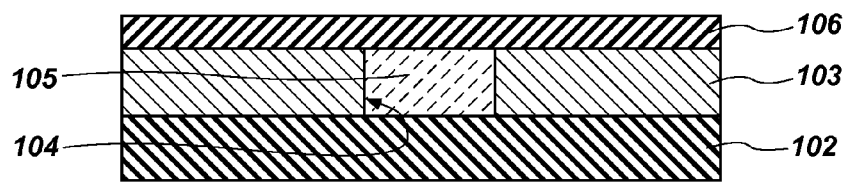

Referring now to FIG. 2B, the active material 106 may be formed over the dielectric material 103 and the conductive material 105. The active material 106 may be configured to enable metal ions to move (e.g., drift) therein responsive to a voltage applied across the active material 106. The active material 106 may be an oxide material (e.g., an oxide glass), such as, for example, at least one of a transition metal oxide (e.g., $HfO_x$, $ZrO_x$, $WO_x$, etc.), a silicon oxide (e.g., $SiO_2$), an aluminum oxide (e.g., $Al_2O_3$), or a chalcogenide material (e.g., a chalcogenide glass). The active material 106 may be formed by conventional methods known in the art and not described herein in detail. By way of example and not limitation, the active material 106 may be formed by at least one of PVD, CVD, and ALD techniques.

Figure 2C:
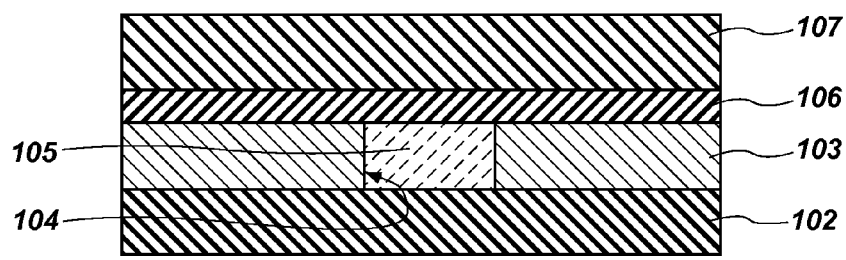

As illustrated in FIG. 2C, the ion source material 107 may be formed over the active material 106. The ion source material 107 may be formed from a chalcogenide material including at least one of the chalcogen elements, such as sulfur (S), selenium (Se), and tellurium (Te). The ion source material 107 may also be formed to include an active metal species, such as copper (Cu) or silver (Ag), within the chalcogenide material for providing ions to the active material 106 when a voltage is applied across the active material 106. The ion source material 107 may be formed by conventional methods known in the art and not described herein in detail. By way of example and not limitation, the ion source material 107 may be formed by at least one of PVD, CVD, and ALD techniques.

Figure 2D:
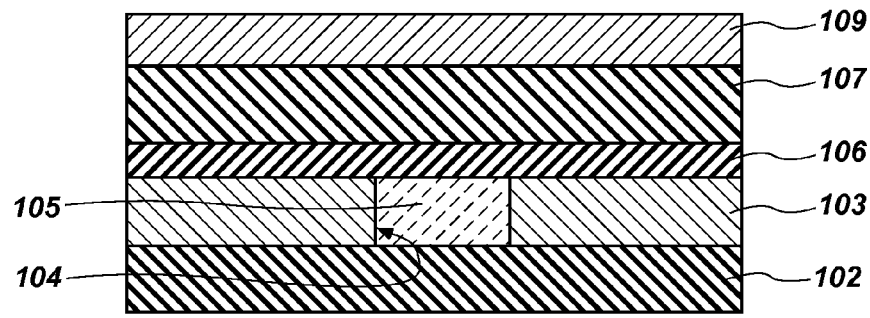

As illustrated in FIG. 2D, the method of forming the CBRAM cell 100 may include forming the second electrode 109 (e.g., a top electrode, an active electrode, an anode) over the ion source material 107. The second electrode 109 may be formed of a metal silicide (e.g., $WSi_x$, $TiSi_x$, $CoSi_x$, $TaSi_x$, $MnSi_x$, $RuSi_x$, $NiSi_x$, where x is a rational number greater than zero). The structure may be heated (e.g., annealed) during the formation of the second electrode 109 or after the formation of the second electrode 109 to react at least some of the materials at the interface between the second electrode 109 and the ion source material 107 to form the interfacial region 108 (FIG. 1).

Accordingly, a method of forming a memory cell (e.g., a CBRAM cell) is disclosed including forming a first electrode, forming an active material, forming an ion source material comprising a chalcogenide material and a metal, and forming a second electrode including metal silicide over the ion source material. Forming the second electrode including metal silicide may include forming a homogeneous, silicon-rich tungsten silicide material. Alternatively, forming the second electrode including metal silicide may include forming a heterogeneous metal silicide material, as will be described in more detail below. The method may also include forming an adhesion material at an interface between the second electrode and the ion source material, as will be described in more detail below.

The CBRAM cell 100 formed by such a method may exhibit improved adhesion and/or reduced internal stress(es) in the materials of the CBRAM cell 100 when compared to CBRAM cells formed by conventional methods. Without being bound by theory, the improved adhesion may be due to controlled interfacial bonding between the silicon of the second electrode 109 and one or more elements of the ion source material 107. For example, the silicon of the second electrode 109 may react with one or more elements of the ion source material 107 at an interface thereof, increasing the intermixing of the material of the second electrode 109 and the material of the ion source material 107. This reaction may form the interfacial region 108 (FIG. 1), which may include a continuous or a discontinuous layer of the reaction product of the silicon of the metal silicide and one or more elements of the ion source material 107. The interfacial region 108 may be broader in the CBRAM cell 100 formed by methods of the present disclosure than an interfacial region in a CBRAM cell formed by conventional methods. The interface between the second electrode 109 including the metal silicide and the ion source material 107 may, thus, be chemisorbed rather than physisorbed as in conventional CBRAM cells. At a desired operating temperature of a device including the CBRAM cell 100, the materials of the second electrode 109 may at least partially intermix with the metal of the ion source material 107 across the interface.

Although the CBRAM cell 100 of FIG. 1 has been described as including a second electrode 109 formed of homogeneous metal silicide, the present disclosure is not so limited. By way of example, FIGS. 3 through 6 show other embodiments of the present disclosure with improved adhesion between the second electrode 109 and the ion source material 107. For convenience and clarity, the interfacial region 108, the active material 106, the dielectric material 103, the conductive material 105, and the first electrode 102 are omitted from FIGS. 3 through 6.

Figure 3:
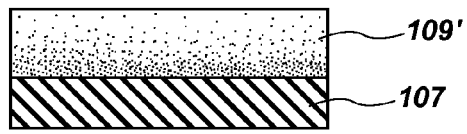
FIG. 3 shows a partial cross-sectional view of an embodiment of a portion of a CBRAM cell according to the present disclosure.

FIG. 3 shows an embodiment of the present disclosure including an ion source material 107 and a second electrode 109' formed of a silicon-rich, non-homogeneous (e.g., heterogeneous) metal silicide. In other words, the second electrode 109' of FIG. 2 may have a variable concentration of silicon across a thickness of the second electrode 109'. The second electrode 109' may include a gradient of silicon across a thickness thereof. For example, there may be a higher concentration of silicon in a portion of the second electrode 109' closer to (i.e., proximal to) the ion source material 107 than a concentration of silicon in a portion of the second electrode 109' more distant from the ion source material 107. The second electrode 109' with a variable concentration of silicon across its thickness may be formed by co-sputtering, for example. Co-sputtering is known in the art and is, therefore, not explained in detail in this disclosure. The second electrode 109' may, for example, provide silicon atoms for bonding with the ion source material 107 while improving conductivity in other portions of the second electrode 109' (i.e., a portion relatively farther away from the ion source material 107).

Figure 4:
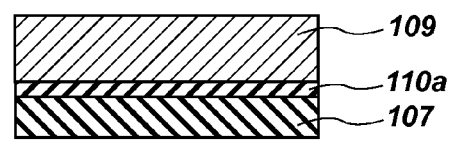
FIG. 4 shows a partial cross-sectional view of another embodiment of a portion of a CBRAM cell according to the present disclosure.

FIG. 4 shows another embodiment of the present disclosure including an ion source material 107, a second electrode 109, and an adhesion material 110a at an interface between the ion source material 107 and the second electrode 109. The adhesion material 110a may be in contact with both the ion source material 107 and the second electrode 109. The adhesion material 110a may be a metal silicide and may be silicon-rich, as described above. The metal silicide adhesion material 110a may provide improved adhesion between the ion source material 107 and the second electrode 109 without the need for forming the entire second electrode 109 of the metal silicide having the same concentration of silicon. For example, in some embodiments, the adhesion material 110a may be formed of a metal silicide with one concentration of silicon (e.g., a relatively high concentration) and the second electrode 109 may be formed of a metal silicide with another concentration of silicon (e.g., a relatively low concentration, a stoichiometric metal silicide, etc.). Such an adhesion material 110a may, therefore, provide advantages in cost and device performance (e.g., conductivity of the second electrode 109), for example.

Figure 5:
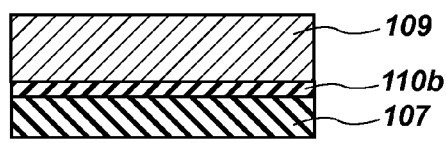
FIG. 5 shows a partial cross-sectional view of another embodiment of a portion of a CBRAM cell according to the present disclosure.

FIG. 5 shows another embodiment of the present disclosure including an ion source material 107, a second electrode 109, and an adhesion material 110b at an interface between the ion source material 107 and the second electrode 109. The adhesion material 110b may be in contact with both the ion source material 107 and the second electrode 109. The adhesion material 110b may be silicon. The silicon adhesion material 110b may provide improved adhesion between the ion source material 107 and the second electrode 109.

Figure 6:
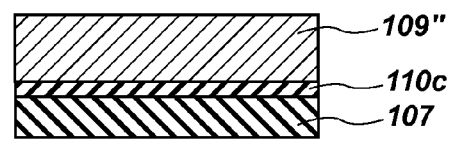
FIG. 6 shows a partial cross-sectional view of another embodiment of a portion of a CBRAM cell according to the present disclosure.

FIG. 6 shows yet another embodiment of the present disclosure including a ion source material 107, a second electrode 109", and an adhesion material 110c at an interface between the ion source material 107 and the second electrode 109". The second electrode 109" may be a metal material, such as tungsten, ruthenium, platinum, cobalt-tungsten-phosphorous, titanium nitride, tungsten nitride, or tantalum nitride, rather than a metal silicide as described above. The adhesion material 110c may be formed of a metal silicide and may be in contact with both the ion source material 107 and the second electrode 109". For example, the adhesion material 110c may be formed by forming the metal silicide over the ion source material 107 by conventional methods and forming the second electrode 109" over the adhesion material 110c. The metal silicide of the adhesion material 110c may be silicon-rich, as described above. The metal of the metal silicide of the adhesion material 110c may be the same element as the metal of the second electrode 109".

In the embodiments of FIGS. 5 and 6, the ion source material 107, the adhesion material 110b, 110c, and the second electrode 109, 109" may be heated to diffuse silicon atoms (from the adhesion material 110b, 110c) into the ion source material 107 and into the second electrode 109, 109". The silicon atoms may react with at least one element from the ion source material 107 and with at least one element from the second electrode 109, 109". Accordingly, a metal silicide (not shown) may be formed in at least portions of one or both of the ion source material 107 and the second electrode 109, 109". Thus, even in an embodiment in which the second electrode 109" is initially formed of a metal (i.e., without metal silicide), the presence of the adhesion material 110c and the heating may enable the metal of the second electrode 109" to react with the silicon of the adhesion material 110c and form the metal silicide in at least a portion of the second electrode 109". Such a configuration may, therefore, enable chemisoprtion and improved intermixing of the materials at or across the interface of the ion source material 107 and the second electrode 109, 109", as described in more detail below.

Accordingly, a memory cell (e.g., a CBRAM cell) of the present disclosure may include a first electrode, an active material in electrical contact with the first electrode, an ion source material over the active material, a second electrode formed of an elemental metal over the ion source material, and an adhesion material including a metal silicide positioned between the ion source material and the second electrode. The metal of the metal silicide adhesion material may be the same element as the metal of the second electrode.

Although FIGS. 1 and 2D through 5 show discrete boundaries between the ion source material 107 and the second electrode 109 (and optionally the adhesion material 110a, 110b, 110c or the interfacial region 108) for clarity, in some embodiments the boundaries between the materials may not be discrete. In other words, materials at the interface may be partially diffused into adjacent materials. For example, reaction of the silicon of the metal silicide of the second electrode 109 with at least one element of the ion source material 107 may cause some intermixing of the materials across the interface between the ion source material 107 and the second electrode 109. Accordingly, the interface between the ion source material 107 and the second electrode 109 may include a gradual change in concentration (e.g., a gradient) of the various materials, as opposed to a discrete change from one material to another. Thus, the presence of the migration and bonding of the various materials may improve adhesion between the ion source material 107 and the second electrode 109.

Referring again to FIGS. 1 through 6, a method of adhering a material including copper and a material including tungsten is also disclosed. A first electrode 102 may be formed on a substrate (not shown) and an active material 106 may be formed over the first electrode 102, the active material 106 in electrical contact with the first electrode 102 (e.g., through the conductive material 105). A material including copper may be formed as the ion source material 107 and a tungsten silicide material (i.e., a material including tungsten) may be formed as the second electrode 109 over the material including copper. The material including copper and the tungsten silicide material may be treated (e.g., heated, annealed) to intermix and/or react at least one of copper from the material including copper, tungsten from the tungsten silicide material, and silicon from the tungsten silicide material across an interface between the material including copper and the tungsten silicide material. Forming the material including copper may include, for example, forming a chalcogenide material with copper ions diffused therein as the ion source material 107. Forming the tungsten silicide material may include forming a silicon-rich tungsten silicide material as the second electrode 109, as described above. The adhesion material 110a, 110b, 110c including one of silicon and tungsten silicide may be formed between the material including copper and the tungsten silicide material. By forming the second electrode 109 from tungsten silicide, the CBRAM device 100 may exhibit improved adhesion between the material including copper and the tungsten silicide material.

Accordingly, a method of adhering a material including copper to a material including tungsten is described including forming first electrode on a substrate, forming an active material in electrical contact with the first electrode, forming a material including copper, forming a tungsten silicide material over the material including copper, and treating the material including copper and the tungsten silicide material to intermix at least one of copper, tungsten, and silicon across an interface between the material including copper and the tungsten silicide material. Forming the material including copper may include forming a chalcogenide material including copper. Forming the tungsten silicide material may include forming a substantially homogeneous silicon-rich tungsten silicide material. Alternatively, forming the tungsten silicide material may include forming a silicon-rich tungsten silicide material with variable concentrations of silicon across a thickness of the tungsten silicide material, such as a higher concentration of silicon in a region of the tungsten silicide proximal to the material including copper. The method may further include forming an adhesion material of silicon or tungsten silicide between the material including copper and the tungsten silicide material.

Figure 7:
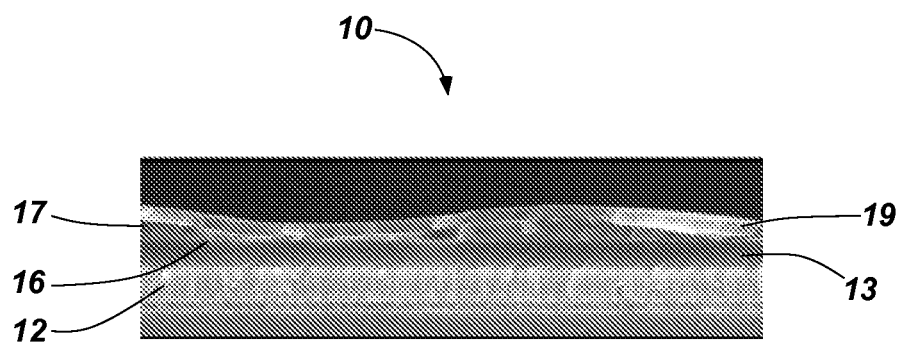
FIG. 7 is a scanning electron microscopy (SEM) image of a CBRAM stack cross section of a control sample.

FIG. 7 is an SEM image of a cross section of a control experimental CBRAM stack 10 including a bottom electrode 12 of tungsten, a dielectric material 13 of silicon nitride, an active material 16 of zirconium oxide, an ion source material 17 including copper and tellurium, and a top electrode 19 of tungsten. Each material was formed at a thickness of between about 200 Å and about 300 Å, except for the active material 16, which was formed at a thickness of about 20 Å. The CBRAM stack 10 was heated to a temperature of about 270° C. to simulate subsequent processing conditions. Although the materials were each initially formed in a substantially planar configuration, the tungsten of the top electrode material 19 deformed after exposure of the CBRAM stack 10 to heat, as can be seen in FIG. 6. Portions of the ion source material 17 also shifted (i.e., were extruded) to conform to the deformed top electrode 19. Therefore, the ion source material 17 in the CBRAM stack 10 is not of uniform thickness. Due to the deformation, an apparatus including a plurality of CBRAM cells formed from the CBRAM stack 10 of FIG. 6 may have poor and unpredictable performance, or may not function at all. Furthermore, the CBRAM stack 10 has a curved (e.g., non-planar) upper surface, which may affect the ability to uniformly etch the CBRAM stack 10 in subsequent processing, such as to form individual CBRAM cells. In other control samples (not shown) having a top electrode of tungsten, adhesive failure was observed at the interface between the top electrode and an underlying ion source material.

Without being bound to a particular theory, it is believed that internal stress in the tungsten of the top electrode 19 combined with little intermixing of materials across the interface between the top electrode material 19 and the ion source material 17 contributed to the observed deformation (and adhesive failure in other control samples).

Figure 8:
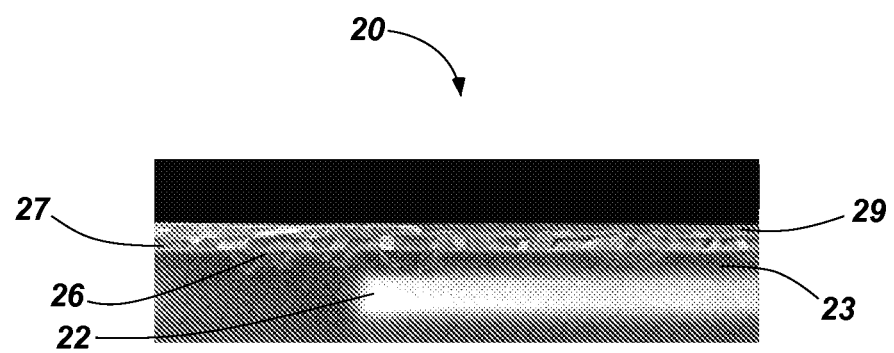
FIG. 8 is a SEM image of a CBRAM stack cross section formed by an embodiment of the present disclosure, such as the method illustrated in FIGS. 2A through 2D.

FIG. 8 is an SEM image of a cross section of an experimental CBRAM stack 20 according to an embodiment of the present disclosure. The CBRAM stack 20 included a bottom electrode 22 of tungsten, a dielectric material 23 of silicon nitride, an active material 26 of zirconium oxide, an ion source material 27 including copper and tellurium, and a top electrode 29 of silicon-rich tungsten silicide. The silicon-rich tungsten silicide included a Si:W ratio of between about 2.4:1 and about 2.6:1. Each material was formed at a thickness of between about 200 Å and about 300 Å, except for the active material 26, which was formed to a thickness of about 20 Å. The CBRAM stack 20 was heated to a temperature of about 270° C. to simulate subsequent processing conditions. The substitution of silicon-rich tungsten silicide in the top electrode 29 in place of the tungsten of the top electrode material 19 (FIG. 7) enabled the CBRAM stack 20 to maintain its substantially planar shape, as can be seen in FIG. 8. Furthermore, the thickness of the ion source material 27 is substantially uniform. Due to the planarity of the top electrode 29 and the uniformity of the ion source material 27, the CBRAM stack 20 may be readily etched, and devices (e.g., CBRAM cells) formed from the CBRAM stack 20 may be operable.

Without being bound to a particular theory, it is believed that the silicon atoms of the silicon-rich tungsten silicide of the top electrode 29 may be available for reacting with at least one element of the ion source material 27 to provide improved intermixing of materials across an interface between the top electrode 29 and the ion source material 27. The materials at the interface may be chemisorbed rather than physisorbed. In addition, the tungsten silicide of the top electrode 29 may exhibit lower internal stress compared to a top electrode formed of tungsten.

Figure 9:
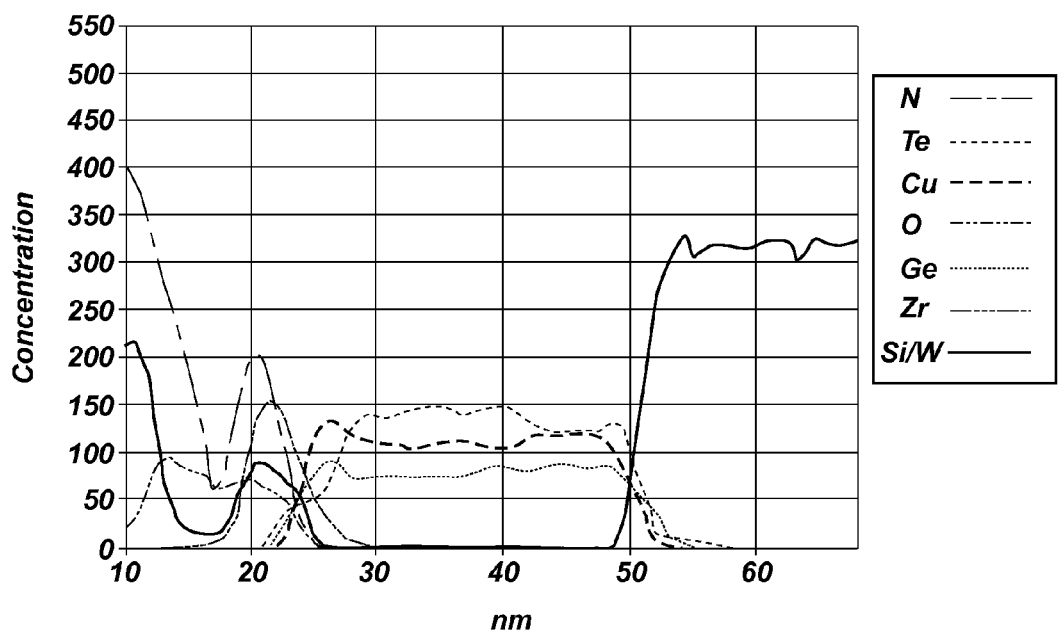
FIG. 9 is a graph, which shows the concentration of various elements in a CBRAM stack similar to that shown in FIG. 7 as a function of the location in the CBRAM stack.
Figure 10:
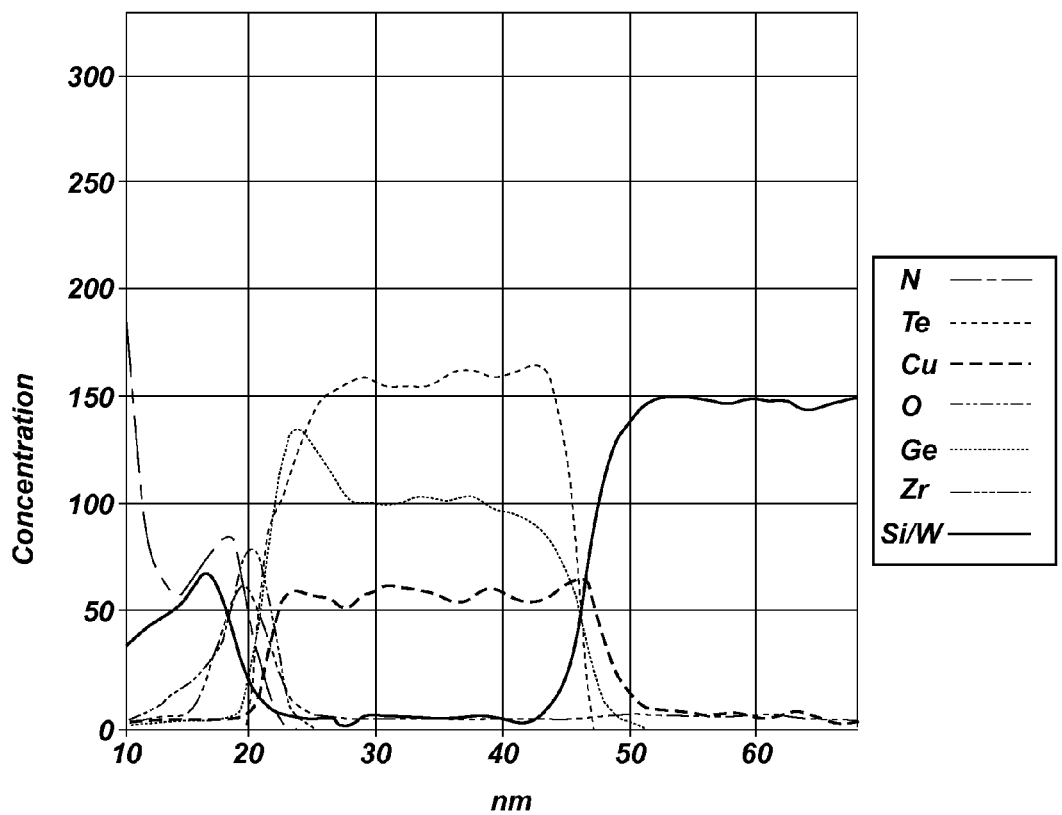
FIG. 10 is a graph, which shows the concentration of various elements in a CBRAM stack similar to that shown in FIG. 8 as a function of the location in the CBRAM stack.

FIGS. 9 and 10 are graphs showing elemental concentrations in experimental CBRAM stacks, such as those shown in FIGS. 7 and 8, respectively, as a function of location in the CBRAM stacks. The graph of FIG. 9 was generated by measuring the concentration of the various elements in the materials of a CBRAM stack having a tungsten top electrode, similar to the CBRAM stack 10 shown in FIG. 7. The graph shows the concentration of the various elements in the materials in the CBRAM stack including a silicon nitride dielectric material (shown by the relatively high concentration of Si/W and N from about 10 nm to about 15 nm), a zirconium oxide active material (shown by the spike in Zr at about 21 nm), a copper-tellurium-germanium ion source material (shown by the relatively high concentration of Cu, Te, and Ge between about 22 nm and about 50 nm), and a tungsten top electrode (shown by the relatively high concentration of Si/W between about 50 nm and about 70 nm). As can be seen in the graph at about 50 nm, the tungsten of the top electrode and the copper of the ion source material overlap over a range of only about 2 nm to about 4 nm. The slope of the Si/W line between about 50 nm and about 58 nm is steep, indicating little intermixing of the copper and tungsten across the interface between the ion source material and the top electrode. The materials at the interface may be physisorbed.

The graph of FIG. 10 was generated by measuring the concentration of the elements in the various materials of a CBRAM stack having a tungsten silicide top electrode, similar to the CBRAM stack 20 shown in FIG. 8. The graph shows the concentration of the elements of the various materials in the CBRAM stack including a silicon nitride dielectric material (shown by the spike of Si/W and N from about 10 nm to about 15 nm), a zirconium oxide active material (shown by the spike in Zr at about 20 nm), a copper-tellurium-germanium ion source material (shown by the relatively high concentration of Cu, Te, and Ge between about 22 nm and about 48 nm), and a tungsten silicide top electrode (shown by the relatively high concentration of Si/W between about 42 nm and about 70 nm). As can be seen in the graph at about 47 nm, the tungsten silicide of the top electrode and the copper of the ion source material overlap over a range of about 8 nm to about 10 nm. Comparing the region of overlap of the graph in FIG. 10 with the region of overlap of the graph in FIG. 9, it can be seen that the materials of the top electrode and of the ion source material of the graph in FIG. 10 intermix more readily across the interface between the top electrode and the ion source material than in the graph in FIG. 9. In addition, the slope of the Si/W line between about 47 nm and about 51 nm of FIG. 10 is less steep than the slope of the corresponding portion of the Si/W line in FIG. 9, indicating intermixing of the materials of the top electrode and of the ion source material. Accordingly, without being bound to a particular theory, it is believed that the use of the metal silicide in the top electrode enables greater intermixing of the materials of the top electrode and of the ion source material across the interface between the materials and, accordingly, improves adhesion between these two materials. The materials at the interface may be chemisorbed. In addition, the top electrode of metal silicide may have a reduced internal stress compared to a top electrode formed of a pure metal (e.g., tungsten). By way of example and not limitation, a tungsten silicide material may have an internal stress that is about one third the internal stress of a tungsten material.

Figure 11:
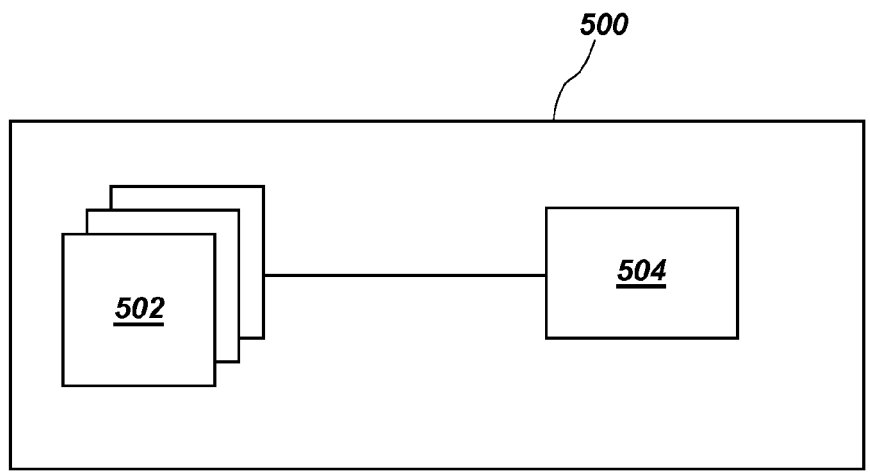
FIG. 11 is a simplified block diagram of a memory device including a memory array of one or more embodiments of the CBRAM cell described herein.

With reference to FIG. 11, illustrated is a simplified block diagram of a memory device 500 implemented according to one or more embodiments described herein. The memory device 500 includes a memory array 502 and a control logic component 504. The memory array 502 may include a plurality of CBRAM cells 100, as described above. The control logic component 504 may be configured to operatively interact with the memory array 502 so as to read, write, or refresh any or all CBRAM cells 100 within the memory array 502.

Accordingly, a memory device comprising a memory array is disclosed. The memory array comprises a plurality of memory cells (e.g., CBRAM cells 100). Each memory cell of the plurality comprises a top electrode that includes a metal silicide.

Figure 12:
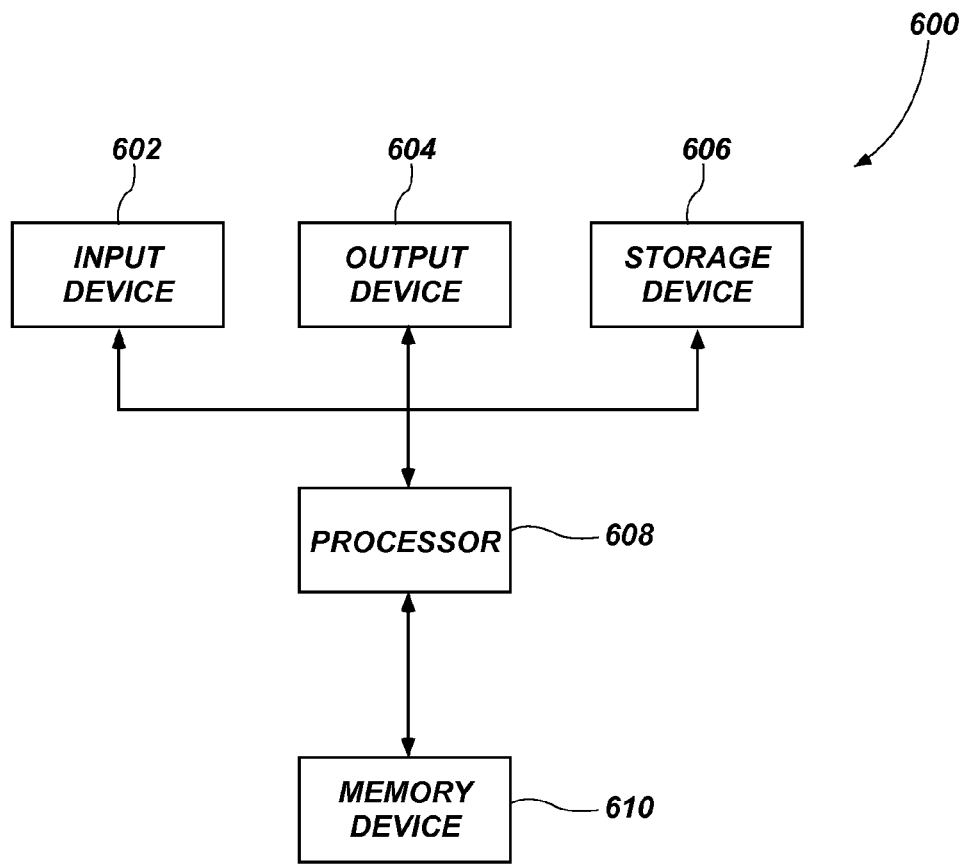
FIG. 12 is a simplified block diagram of a system implemented according to one or more embodiments described herein.

With reference to FIG. 12, illustrated is a simplified block diagram of a system 600 implemented according to one or more embodiments described herein. The system 600 includes at least one input device 602. The input device 602 may be a keyboard, a mouse, or a touch screen. The system 600 further includes at least one output device 604. The output device 604 may be a monitor, touch screen, or speaker, for example. The input device 602 and the output device 604 are not necessarily separable from one another. The system 600 further includes a storage device 606. The input device 602, output device 604, and storage device 606 are coupled to a conventional processor 608. The system 600 further includes a memory device 610 coupled to the processor 608. The memory device 610 includes at least one CBRAM cell, such as the CBRAM cell 100, according to one or more embodiments described herein. The memory device 610 may include an array of CBRAM cells. The system 600 may be incorporated within a computing, processing, industrial, or consumer product. For example, without limitation, the system 600 may be included within a personal computer, a handheld device, a camera, a phone, a wireless device, a display, a chip set, a game, a vehicle, or other known systems.

Accordingly, a system is disclosed comprising a memory array comprising a plurality of memory cells (e.g., CBRAM cells). Each memory cell of the plurality comprises a top electrode including a metal silicide.

An apparatus (e.g., a memory device 500, a system 600 including a memory device 610) is also disclosed including a plurality of memory (e.g., CBRAM) cells. Each memory cell of the plurality of memory cells of the apparatus includes a first electrode, an active material over the first electrode, an ion source material over the active material, and a second electrode including metal silicide over the ion source material. The metal silicide of the second electrode of each memory cell may be a silicon-rich metal silicide. Each memory cell of the apparatus may also include an adhesion material at an interface between the ion source material and the second electrode.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, combinations, equivalents, and alternatives falling within the scope of the disclosure as defined by the following appended claims and their legal equivalents.

What is claimed is:

1. A memory cell comprising:
a first electrode;
an active material in electrical contact with the first electrode;
an ion source material over the active material;
a second electrode comprising a metal silicide over the ion source material; and
an electrically conductive adhesion material in contact with the ion source material and the second electrode, the electrically conductive adhesion material comprising at least one element of the ion source material and at least one of silicon and a metal silicide of the second electrode.

2. The memory cell of claim 1, wherein:
the metal silicide of the second electrode is silicon-rich and comprises at least one of tungsten silicide, titanium silicide, cobalt silicide, tantalum silicide, manganese silicide, ruthenium silicide, and nickel silicide; and
the ion source material comprises a chalcogenide material and copper.

3. The memory cell of claim 1, wherein the second electrode comprises tungsten silicide and the electrically conductive adhesion material comprises silicon.

4. The memory cell of claim 1, wherein the metal silicide of the second electrode comprises a homogeneous silicon-rich metal silicide.

5. The memory cell of claim 1, wherein the metal silicide of the second electrode comprises a silicon-rich metal silicide having a gradual change in concentration of silicon across a thickness of the second electrode.

6. The memory cell of claim 1, wherein the active material comprises at least one of a transition metal oxide, an aluminum oxide, a silicon oxide, and a chalcogenide material.

7. The memory cell of claim 1, wherein the ion source material comprises copper and at least one of tellurium and germanium.

8. The memory cell of claim 1, further comprising a dielectric material between the first electrode and the active material, the dielectric material having an opening therethrough filled at least partially with a conductive material providing electrical contact between the first electrode and the active material.

9. The memory cell of claim 1, wherein the electrically conductive adhesion material comprises at least one reaction product of the at least one element of the ion source material and the at least one of silicon and metal silicide of the second electrode.

10. A memory cell, comprising:
a first electrode on a side of a substrate;
an active material in electrical contact with the first electrode;
an ion source material on a side of the active material opposite the first electrode;
a second electrode formed of an elemental metal on a side of the ion source material opposite the active material and located distal to the substrate relative to the first electrode; and
an electrically conductive adhesion material including a metal silicide in electrical contact with the ion source material and the second electrode, the metal of the metal silicide and the elemental metal of the second electrode being the same element, the electrically conductive adhesion material also including at least one element of the ion source material.

11. The memory cell of claim 10, wherein:
the second electrode comprises tungsten; and
the electrically conductive adhesion material comprises a silicon-rich tungsten silicide.

12. An apparatus comprising:
a plurality of memory cells, each memory cell of the plurality of memory cells comprising:
a first electrode;
an active material over the first electrode;
an ion source material comprising a metal over the active material; and
a second electrode comprising a metal silicide over the ion source material,
wherein the metal silicide comprises a silicon-rich metal silicide having a gradual change in concentration of silicon across a thickness of the second electrode and a higher concentration of silicon in a region of the metal suicide proximate to the ion source material.

13. The apparatus of claim 12, wherein each memory cell of the plurality of memory cells further comprises an adhesion material at an interface between the second electrode and the ion source material.

14. The apparatus of claim 13, wherein the adhesion material comprises one of the metal silicide and silicon.

15. A method of forming a memory cell, comprising:
forming a first electrode comprising a conductive material;
forming an active material over and in electrical contact with the first electrode;
forming an ion source material over the active material, the ion source material comprising a chalcogenide material and a metal;
forming a second electrode comprising a metal silicide over the ion source material; and
reacting materials at an interface between the second electrode and the ion source material to form an adhesion material comprising silicon of the metal silicide and at least one element of the ion source material at the interface between the second electrode and the ion source material.

16. The method of claim 15, wherein:
forming an ion source material comprises forming a copper-tellurium material, a copper-tellurium-germanium material, or a copper-tellurium-silicon material; and
forming a second electrode comprising a metal silicide comprises forming a second electrode comprising tungsten silicide.

17. The method of claim 16, wherein forming a second electrode comprising tungsten silicide comprises forming a homogeneous, silicon-rich tungsten silicide material.

18. The method of claim 17, wherein forming a homogeneous, silicon-rich tungsten silicide material comprises forming a tungsten silicide material having between about 2.1 silicon atoms per tungsten atom and about 3.5 silicon atoms per tungsten atom.

19. The method of claim 16, wherein forming a second electrode comprising tungsten silicide comprises forming a heterogeneous tungsten silicide material having a higher concentration of silicon in a portion of the second electrode proximate to the ion source material.

20. The method of claim 15, wherein reacting materials at an interface between the second electrode and the ion source material comprises heating the second electrode.

21. A method of adhering a material including copper and a material including tungsten, the method comprising:
   forming a first electrode on a substrate;
   forming an active material in electrical contact with the first electrode;
   forming a material including copper over the active material;
   forming a tungsten silicide material over the material including copper; and
   treating the material including copper and the tungsten silicide material to intermix at least one of copper from the material including copper, tungsten from the tungsten silicide material, and silicon from the tungsten silicide material across an interface between the material including copper and the tungsten silicide material.

22. The method of claim 21, wherein forming the material including copper comprises forming a chalcogenide material including copper.

23. The method of claim 21, wherein forming a tungsten silicide material comprises forming a substantially homogeneous silicon-rich tungsten silicide material.

24. The method of claim 21, wherein forming a tungsten silicide material comprises forming a silicon-rich tungsten silicide material with a higher concentration of silicon in a region of the tungsten silicide material proximate to the material including copper.

25. The method of claim 21, further comprising forming an adhesion material comprising one of silicon and tungsten silicide over and in contact with the material including copper and wherein forming a tungsten silicide material comprises forming tungsten silicide over and in contact with the adhesion material.

* * * * *